US007759668B2

United States Patent
Ahn

(10) Patent No.: US 7,759,668 B2
(45) Date of Patent: Jul. 20, 2010

(54) MEMORY DEVICE INCLUDING PHASE-CHANGEABLE MATERIAL REGION AND METHOD OF FABRICATING THE SAME

(75) Inventor: Dong-Ho Ahn, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 160 days.

(21) Appl. No.: 11/844,534

(22) Filed: Aug. 24, 2007

(65) Prior Publication Data
US 2008/0054245 A1 Mar. 6, 2008

(30) Foreign Application Priority Data
Aug. 29, 2006 (KR) ........................ 10-2006-0082391

(51) Int. Cl.
*H01L 29/04* (2006.01)
(52) U.S. Cl. ................. 257/3; 257/4; 257/203; 257/734; 257/E31.029; 365/148; 977/832; 977/943; 438/131
(58) Field of Classification Search ............. 257/2–5, 257/184, 194, 200, 203, 400, 421, 530, 734, 257/E31.029; 438/131; 977/762, 734, 810, 977/813, 832, 932, 940, 943; 365/145, 148, 365/175
See application file for complete search history.

(56) References Cited
U.S. PATENT DOCUMENTS
2003/0052351 A1 3/2003 Xu et al.

2006/0197130 A1 9/2006 Suh et al.
2008/0023685 A1* 1/2008 Czubatyj et al. .............. 257/2

(Continued)

FOREIGN PATENT DOCUMENTS
KR 10-2006-0001087 A 1/2006

(Continued)

OTHER PUBLICATIONS
Lankhorst et al; "Low-Cost and Nanoscale Non-Volatile Memory Concept for Future Silicon Chips"; Nature Materials; Advanced Online Publication; www.nature.com/naturematerials; pp. 1-6; Published online: Mar. 13, 2005.

(Continued)

*Primary Examiner*—Evan Pert
*Assistant Examiner*—Scott R Wilson
(74) *Attorney, Agent, or Firm*—Myers Bigel Sibley & Sajovec, P.A.

(57) ABSTRACT

A memory device includes first and second electrodes and a phase-changeable material region disposed between the first and second electrodes and including first and second portions contacting respective ones of the first and second electrodes and a third portion interconnecting the first and second portions and configured to preferentially heat with respect to the first and second portions responsive to a current passing between the first and second electrodes. The first and second portions of the phase-changeable material region may contact respective ones of the first and second electrodes at respective first and second electrode contact surfaces and the third portion may have a cross-sectional area that is less than areas of each of the first and second contact surfaces. For example, the third portion may include a filament portion extending between the first and second portions.

14 Claims, 4 Drawing Sheets

U.S. PATENT DOCUMENTS

| | | | |
|---|---|---|---|
| 2008/0121861 A1* | 5/2008 | Lai et al. | 257/4 |
| 2008/0157051 A1* | 7/2008 | Lam et al. | 257/3 |
| 2009/0020746 A1* | 1/2009 | Lai et al. | 257/4 |

FOREIGN PATENT DOCUMENTS

| | | |
|---|---|---|
| KR | 1020060001094 A | 1/2006 |
| KR | 1020060001101 A | 1/2006 |
| KR | 10-2006-0065919 A | 6/2006 |
| KR | 10-0707182 B1 | 4/2007 |

OTHER PUBLICATIONS

Neale; "Amorphous Non-Volatile Memory: The Past and The Future" *Electronic Engineering*; 10 pages; Apr. 2001.

* cited by examiner

MEMORY DEVICE INCLUDING PHASE-CHANGEABLE MATERIAL REGION AND METHOD OF FABRICATING THE SAME

CROSS-REFERENCE TO RELATED APPLICATIONS

This U.S. non-provisional patent application Claims priority under 35 U.S.C §119 of Korean Patent Application 102006-0082391 filed on Aug. 29, 2006, the entirety of which is hereby incorporated by reference.

BACKGROUND

The present invention generally relates to non-volatile memory devices and methods of fabricating the same and, more particularly, to phase-changeable memory cells and methods of fabricating the same.

Non-volatile memory devices typically retain their stored data even when their power supplies are interrupted. Many non-volatile memory devices use flash memory cells having a stacked gate structure. The stacked gate structure typically includes a tunnel oxide, a floating gate, an intergate dielectric, and a control gate electrode. Improving the tunnel oxide and increasing a cell coupling ratio may enhance reliability and programming efficiency of the flash memory cells.

New non-volatile memory devices, referred to here as phase-changeable memory devices, have been proposed as a replacement for flash memory devices. Phase-changeable materials have at least two stable states, which may be achieved using temperature variation. For example, if a phase-changeable material is cooled after being heated to a temperature higher than a melting temperature, it may achieve an amorphous state. On the other hand, if the same phase-changeable material is cooled after being heated to a temperature higher than a crystallization temperature but lower than the melting temperature, it may achieve a crystalline state. A resistivity of the phase-changeable material layer in the amorphous state may be higher than in the crystalline state, and the variance in resistance may be used to discriminate between a logic "1" or logic "0" in a phase-changeable memory cell.

Reducing a contact area between an electrode and a phase-changeable material to enhance efficiency of a phase-changeable memory device is described in U.S. Pat. No. 6,117,720 entitled "METHOD OF MAKING AN INTEGRATED CIRCUIT ELECTRODE HAVING A REDUCED CONTACT AREA".

FIG. 1 is a cross-sectional view of a typical conventional phase-changeable memory device. The illustrated conventional phase-changeable memory device includes a bottom electrode 60 formed on a semiconductor substrate and an interlayer dielectric 50 disposed on the bottom electrode 60. A plug 42 is disposed within an opening in the interlayer dielectric 50 and is electrically connected to the bottom electrode 60. Spacers 44 are formed on sidewalls of the interlayer dielectric 60 in the opening and on the plug 42. A contact 46 is formed between the spacers 44, in contact with the plug 42. The contact 46 may be made of a phase-changeable material or a conductive material. If the contact 46 is made of a conductive material, a phase-changeable layer 62 may be formed on the interlayer dielectric 50 and the contact 46.

Such a conventional phase-changeable memory device has a stacked structure and may, therefore, provide the advantages of a smaller occupied area and a higher integration density. However, a stress may be generated at or near the contact area between a conductive material and a phase-changeable material that may degrade phase-changeable characteristics. The phase change is generally accomplished using heat generated by current passing through the contact resistance of the phase-changeable material and the conductive material. However, heat may be dissipated at or near a boundary 48 of the contact area resulting in an unsatisfactory phase change.

For example, referring to FIG. 2, when current flows through the contact 46 and the bottom electrode 60, heat may be generated at or near a boundary between the contact 46 and the phase-changeable layer 62 due to contact resistance at the boundary. The heat may change the state of the phase-changeable material in a region PC. However, heat e may sometimes be dissipated or lost at or near the boundary resulting in an unsatisfactory phase change. Unsatisfactory phase changes may result in inaccurate data storage.

SUMMARY OF THE INVENTION

In some embodiments of the present invention, a memory device includes first and second electrodes and a phase-changeable material region disposed between the first and second electrodes. The phase-changeable material region includes first and second portions contacting respective ones of the first and second electrodes and a third portion interconnecting the first and second portions and configured to be heated with respect to the first and second portions responsive to a current passing between the first and second electrodes. In some embodiments, the first and second portions of the phase-changeable material region may contact respective ones of the first and second electrodes at respective first and second electrode contact surfaces and the third portion may have a cross-sectional area that is less than areas of each of the first and second contact surfaces. For example, in some embodiments, the first portion may include a first planar region on the first electrode, the third portion may include a filament portion extending from the first region opposite the first electrode through an opening in an insulation layer on the first region and the second portion may include a second planar region on the insulation layer and the filament portion, and the second electrode may be disposed on the second planar region opposite the filament portion.

According to additional embodiments of the present invention, a memory device includes first and second electrodes and a phase-changeable material region disposed between the first and second electrodes and including a first portion in contact with the first electrode, a second portion in contact with the second electrode, and a filamentous third portion connecting the first and second portions. A contact area of the first portion and the first electrode and a contact area of the second portion and the second electrode may each be greater than a cross-sectional area of the third portion. The first and second electrodes and the phase-changeable material region may be configured to confine phase change substantially to the third portion.

Additional embodiments provide methods of fabricating a memory device including forming first and second electrodes and forming a phase-changeable material region in contact with the first and second electrodes and including a first portion in contact with the first electrode, a second portion in contact with the second electrode, and a filamentous third portion connecting the first and second portions. A contact area between the phase-changeable material region and the first electrode and a contact area between the phase-changeable material region and the second electrode may each be greater than a cross sectional area of the third portion.

Forming first and second electrodes may include forming the first electrode on a substrate. Forming a phase-changeable material region in contact with the first and second electrodes and including a first portion in contact with the first electrode, a second portion in contact with the second electrode, and a filamentous third portion connecting the first and second portions may include forming the phase-changeable material region on the first electrode. Forming first and second electrodes may further include forming the second electrode on the phase-changeable material region. In further embodiments, forming the phase-changeable material region on the first electrode includes forming a first insulation layer on the first electrode, forming a second insulation layer on the first insulation layer, forming an opening in the second insulation layer exposing the first insulation layer, etching the first insulation layer via the first opening to form a void above the first electrode, forming a phase-changeable material layer on the second insulation layer and occupying the void and the opening in the second insulation layer, and patterning a portion of the phase-changeable material layer on the second insulation layer.

DETAILED DESCRIPTION OF EMBODIMENTS

Figure 1:
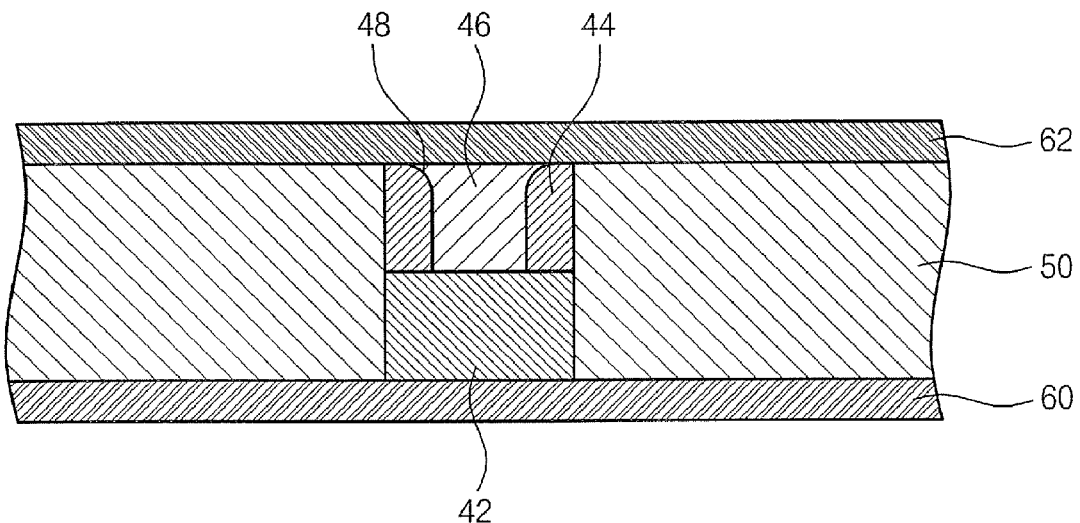
FIG. 1 is a cross-sectional view of a conventional phase-changeable memory device.
Figure 2:
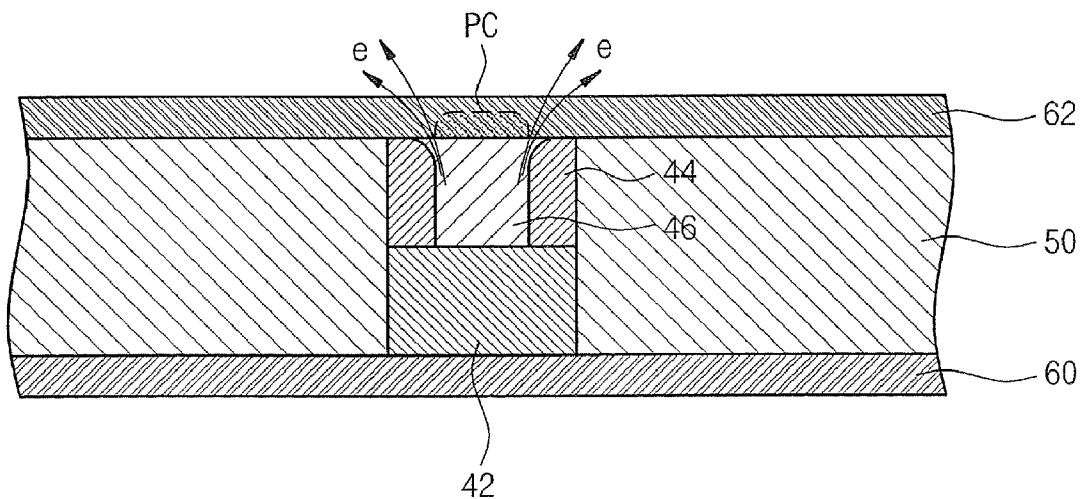
FIG. 2 is a diagram illustrating some possible drawbacks of the conventional phase-changeable memory device of FIG. 1.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," "connected to" and/or "coupled to" another element or layer, the element or layer may be directly on, connected and/or coupled to the other element or layer, or intervening elements or layers may be present. In contrast, when an element is referred to as being "directly on," "directly connected to" and/or "directly coupled to" another element or layer, no intervening elements or layers are present. As used herein, the term "and/or" includes any and all combinations of one or more of the associated listed items.

It will also be understood that, although the terms "first," "second," etc., may be used herein to describe various elements, components, regions, layers and/or sections, these elements, components, regions, layers and/or sections should not be limited by these terms. Rather, these terms are used merely as a convenience to distinguish one element, component, region, layer and/or section from another element, component, region, layer and/or section. For example, a first element, component, region, layer and/or section could be termed a second element, component, region, layer and/or section without departing from the teachings of the present invention.

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly. As used herein, "height" refers to a direction that is generally orthogonal to the faces of a substrate.

The terminology used herein is for the purpose of describing particular embodiments only and is not intended to limit of the invention. As used herein, the singular terms "a," "an" and "the" are intended to include the plural forms as well, unless the context clearly indicates otherwise. It will be further understood that the terms "comprise," "comprising," "includes," "including," "have", "having" and variants thereof specify the presence of stated features, integers, steps, operations, elements, and/or components, but do not preclude the presence and/or addition of one or more other features, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention. Like reference numerals refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
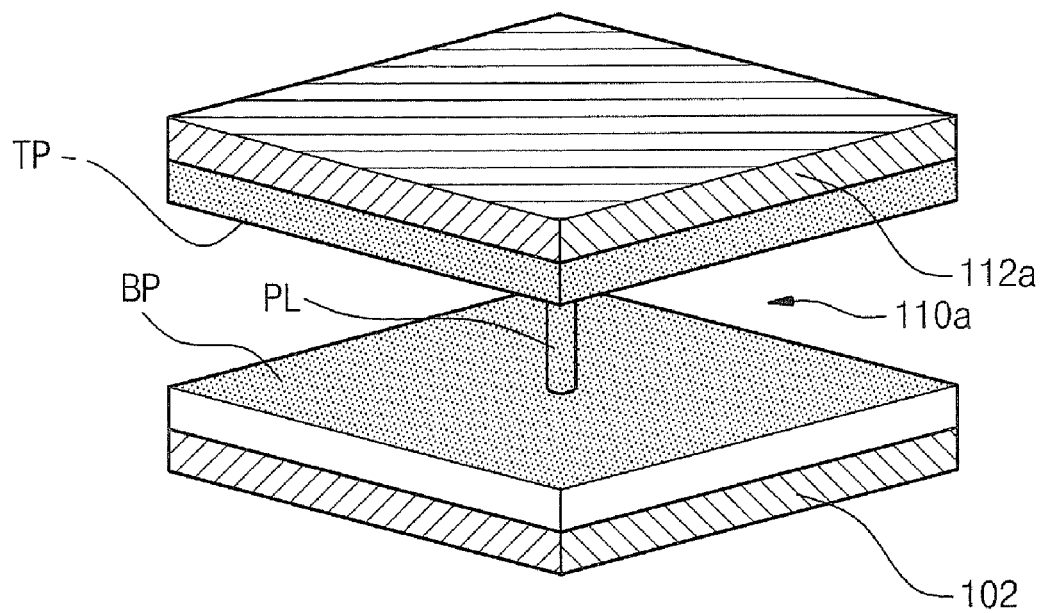
FIGS. 3 and 4 are cross-sectional diagrams of a phase-changeable memory device according to some embodiments of the present invention.
Figure 4:
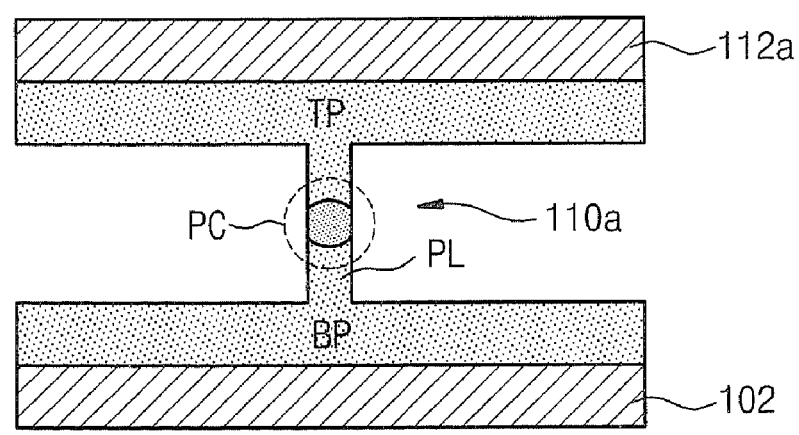

FIGS. 3 and 4 are a perspective view and a cross-sectional view, respectively, of a phase-changeable memory device according to some embodiments of the present invention.

Referring to FIGS. 3 and 4, a bottom electrode 102 and a top electrode 112a are provided. A phase-changeable pattern 110a is interposed between the bottom and top electrodes 102 and 112a. The phase-changeable pattern 110a includes a filament portion PL extending upwardly toward the top electrode 112a from the bottom electrode 102. The cross-sectional area and/or length of the filament portion PL along a plane perpendicular to the current flow therethrough may be such that heat generation is concentrated in the filament portion PL and phase change is substantially confined to the filament portion PL.

The phase-changeable pattern 110a may include a planar top plate portion TP and a planar bottom plate BP coupled to the top and bottom ends of the filament portion PL, respectively. A bottom surface of the bottom plate portion BP is in contact with the bottom electrode 102, and a top surface of the top plate portion TP is in contact with the top electrode 112a. Accordingly, a top surface of the phase-changeable pattern 100a is in contact with the top electrode 112a, and a bottom surface thereof is in contact with the bottom electrode 102. In addition, a contact area with the top electrode 112a and a contact area with the bottom electrode 102 are each larger than a cross-sectional area of the filament portion PL.

A potential difference may be established between the bottom and top electrodes 102 and 112a to generate current through the phase-changeable pattern 110a. Current passing through the filament portion PL generates heat that may cause a phase change. That is, while the state of a phase-changeable layer is conventionally converted using heat generated at a contact surface of an electrode and the phase-changeable layer, in some embodiments of the present invention, phase change may instead be accomplished using heat generated by sheet resistance within the phase-changeable material region, away from electrode contact surfaces. Therefore, it may be possible to reduce or prevent phase-changeable characteristic degradation resulting from stress at a contact boundary. The heat generated using such a technique may provide improved heat isolation. Accordingly, unsatisfactory phase changes occurring at or near a contact surface may be reduced or eliminated which may allow data to be stored more reliably.

As illustrated, phase change occurs in the filament portion PL. Since the top and bottom plate portions TP and BP extending laterally may have an area that is large enough to have a low contact resistance relative to the sheet resistance, the area occupied by a storage portion may be reduced.

Each of the bottom and top electrodes 102 and 112a may be made of a material having superior conductivity. Conventionally, an electrode that is in contact with a phase-changeable portion is made of a high-resistance material because it should have a high resistance at the boundary with a phase-changeable layer. However, in some embodiments of the present invention, since a contact resistance is not used to cause phase change, a wide range of materials may be used for the electrodes.

Generally, resistance is in inverse proportion to cross-sectional area and in direct proportion to length. For this reason, the cross-sectional area and the length of the filament portion PL may be designed according to operating voltage and current conditions of memory devices.

FIGS. 5 through 8 are diagrams illustrating operations for fabricating a phase-changeable memory device according to some embodiments of the present invention.

Figure 5:
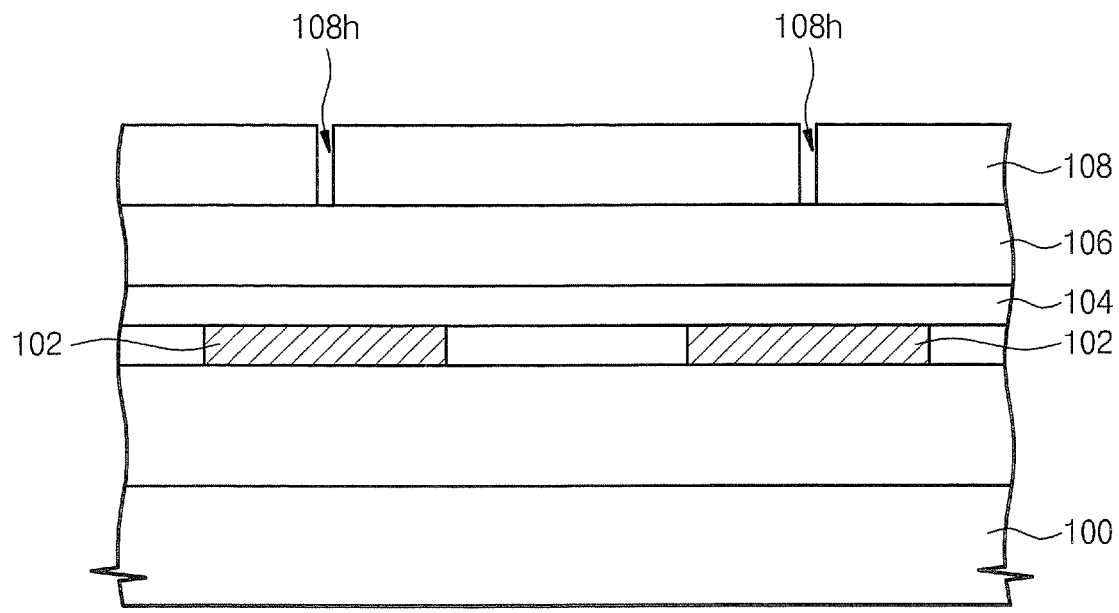
FIGS. 5 through 8 are cross-sectional diagrams illustrating operations for fabricating a phase-changeable memory device according to some embodiments of the present invention.

Referring to FIG. 5, a bottom electrode 102 is formed on a semiconductor substrate 100. Although not shown in the figure, the bottom electrode 102 may be electrically connected to a predetermined region of the semiconductor substrate 100.

The bottom electrode 102 may be made of a material having superior conductivity. The range of useful materials for the bottom electrode 102 may be wider than in a conventional structure. The bottom electrode 102 may include, for example, TiN, TaN, WN, MoN, NbN, TiSiN, TiAlN, TiBN, ZrSiN, WSiN, WBN, ZrAlN, MoSiN, MoAlN, TaSiN, TaAlN, Ti, W, Mo, Ta, TiSi, TaSi, TiON, TiAlON, WON, TaON, and/or a conductive carbon group. In addition, the bottom electrode 102 may be made of one of various conductive materials such as conductive silicon aluminum, copper or the like.

In some embodiments, a first insulation layer 104 and a second insulation layer 106 are formed on the resultant structure where the bottom electrode 102 is formed. Each of the first and second insulation layers 104 and 106 may include silicon nitride, silicon oxide, silicon oxynitride, silicon, aluminum oxide, zirconium oxide, hafnium oxide, hydro-silsesquioxane (HSQ), and/or flowable oxide (FOX). The first insulation layer 104 may be made of a material exhibiting etching selectivity with respect to the second insulation layer 106. For example, for a specific etching solution or a specific etching gas, an etch rate of the first insulation layer 104 may be higher than that of the second insulation layer 106.

A mask pattern 108 with an opening 108h is formed on the second insulation layer 106. The mask pattern 108 may be made of an organic or inorganic material having an etch selectivity with respect to the second insulation layer 106. The size of the opening 108h may be regulated by means of, for example, a double exposure method or conventional size reduction methods.

Figure 6:
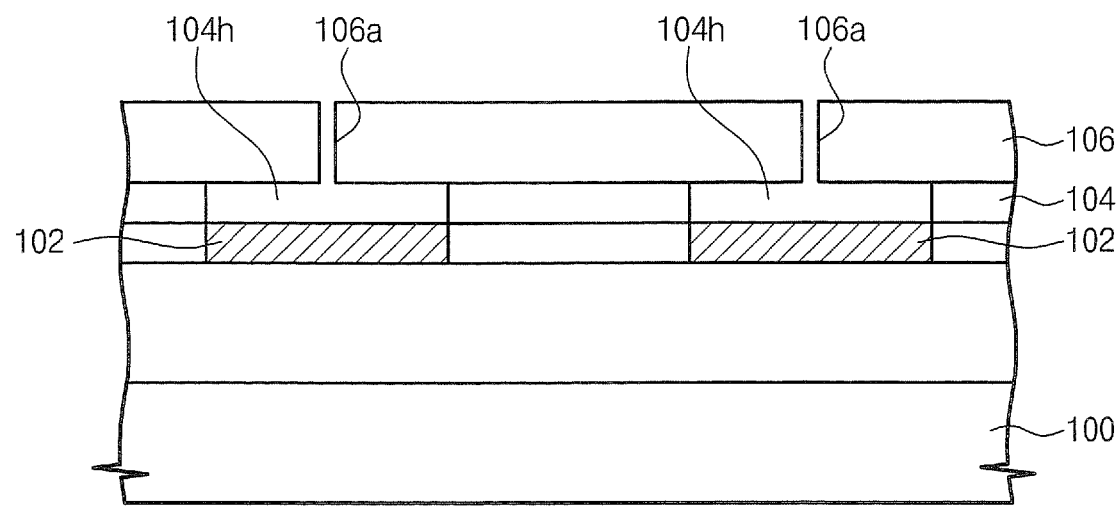

Referring to FIG. 6, the second insulation layer 106 is etched using the mask pattern 108 as an etch mask, forming a hole 106a to expose the first insulation layer 104. The hole 106a may be formed to be disposed on the bottom electrode 102.

The first insulation layer 104 exposed by the hole 106a may be etched laterally to form an undercut void 104h. The formation of the under-cut void 104h may be done by fully removing the first insulation layer 104 on the bottom electrode 102 or the boundary of the undercut region 104h may be disposed on the bottom electrode 102. As a result, a void connected to the hole 106a is formed on the bottom electrode 102 to expose the bottom electrode 102.

The mask pattern 108 may be removed before or after forming the under-cut region 104h. Since the first insulation layer 104 has a higher etch rate than the second insulation layer 106, the first insulation layer 104 may be etched using the second insulation layer 106 as an etch mask. The extension of the hole 106a may be suppressed under the etch condition that the first insulation layer 104 has a higher etch selectivity than the second insulation layer 106. The initial diameter and etch condition of the hole 106a may be selected considering the diameter of a final version of the hole 106a.

Figure 7:
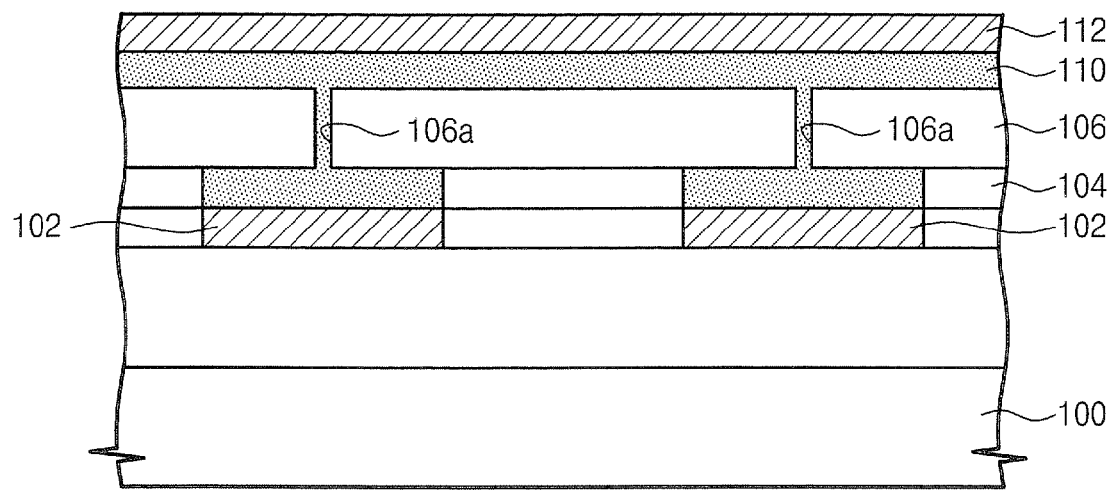

Referring to FIG. 7, a phase-changeable layer 110 and a top electrode layer 112 are sequentially formed on the second insulation layer 106. The phase-changeable layer 110 fills the void 104h through the hole 106a. The void 104h may be filled fully or partially with the phase-changeable layer 110.

The phase-changeable layer 110 may be continuous within the hole 106a and may be formed to be in contact with the bottom electrode 102. The first insulation layer 104 defines the boundary of the phase-changeable layer 110 formed at the void 104h.

In the illustrated embodiments, the phase-changeable layer 110 is formed at the hole 106a and thus may have a filament portion. Since the filament portion may be formed during a deposition process and not by etching, etching damage may be reduced or eliminated. Accordingly, phase-changeable characteristic degradation caused by the etching damage may be reduced.

Figure 8:
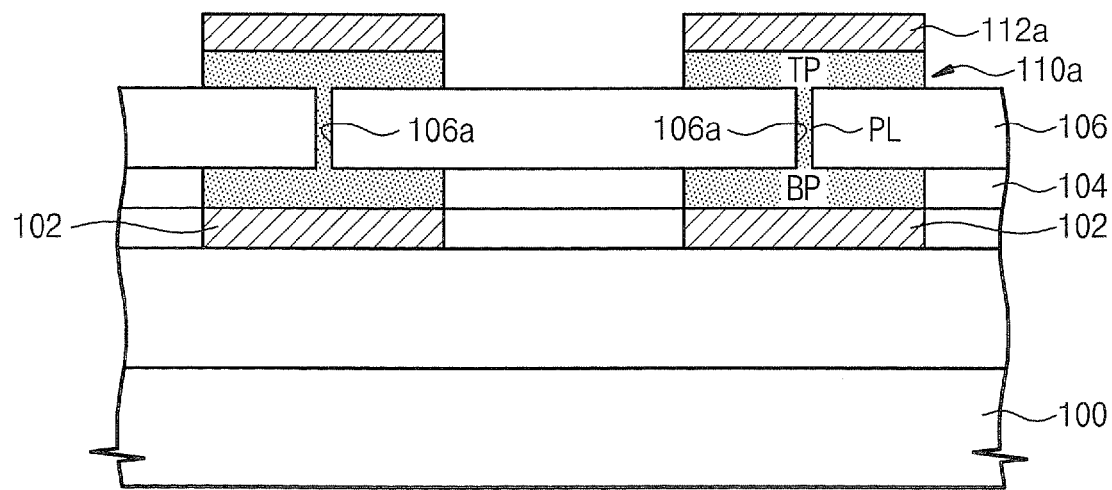

Referring to FIG. 8, the top electrode layer 112 and the phase-changeable layer 110 are successively patterned to form a top electrode 112a and a phase-changeable pattern 110a. The phase-changeable pattern 110a is disposed between the bottom electrode 102 and the top electrode 112*a* to be connected to the bottom electrode 102 and the top electrode 112*a*.

As illustrated, the phase-changeable pattern 110*a* includes a planar bottom plate portion BP having a bottom surface connected to the bottom electrode 102, a planar top plate portion TP having a top surface connected to the top electrode 112*a*, and a filament portion PL connecting the bottom and top plate portions BP and TP. The filament portion PL may have a relatively small cross-section such that heat is generated by a high resistance at the filament portion PL.

In some embodiments of the present invention, areas of the bottom electrode 102 and the top electrode 112*a* are reduced to make the area occupied by a storage portion smaller. A contact area of the phase-changeable pattern 110*a* and the bottom electrode 102 as well as a contact area of the phase-changeable pattern 110*a* and the bottom electrode 112*a* may be made larger than a cross-section area of the filament portion PL. Since the filament portion PL may be relatively thin, it is allowable reducing the areas of the bottom and top electrodes 102 and 112*a*.

The filament portion PL may be formed during the formation of a phase-changeable layer without using an etching process. Thus, phase-changeable characteristic degradation caused by etching damage may be reduced or eliminated. In addition, because the filament portion PL does not contact the electrodes, a phase-changeable characteristic degradation may be further reduced or eliminated.

According to some embodiments of the present invention, a phase-changeable pattern includes a filament portion between a bottom electrode and a top electrode, and phase change is substantially confined to the filament portion. Heat dissipation may be reduced or eliminated at the contact boundary, and heat isolation may be increased, which may provide more reliable data storage capability. Since the filament portion may be formed without etching, phase-changeable characteristic degradation caused by etching damage may be reduced or eliminated. Since the filament portion where phase change occurs is not in contact with a metal layer, phase-changeable characteristic degradation caused by boundary stress may also be reduced or eliminated. The use of a filamentous phase-change region may also allow a high integration density to be achieved.

The foregoing is illustrative of the present invention and is not to be construed as limiting thereof. Although some embodiments of this invention have been described, those skilled in the art will readily appreciate that many modifications are possible in the embodiments without materially departing from the novel teachings and advantages of this invention. Accordingly, all such modifications are intended to be included within the scope of this invention as defined in the Claims. The invention is defined by the following Claims.

What is claimed is:

1. A memory device comprising:
   first and second electrodes; and
   a phase-changeable material region disposed between the first and second electrodes and comprising first and second portions contacting respective ones of the first and second electrodes and a third portion interconnecting the first and second portions and configured to preferentially heat with respect to the first and second portions responsive to a current passing between the first and second electrodes.

2. The device of claim 1, wherein the third portion comprises a current-densifying portion.

3. The device of claim 2, wherein the first and second portions of the phase-changeable material region contact respective ones of the first an second electrodes at respective first and second electrode contact surfaces and wherein the third portion has a cross-sectional area that is less than areas of each of the first and second contact surfaces.

4. The device of claim 1, wherein phase change occurs at the third portion.

5. The device of claim 1:
   wherein the first portion comprises a first planar region on the first electrode;
   wherein the third portion comprises a filament portion extending from the first region opposite the first electrode through an opening in an insulation layer on the first region;
   wherein the second portion comprises a second planar region on the insulation layer and the filament portion; and
   wherein the second electrode is disposed on the second planar region opposite the filament portion.

6. A memory device comprising:
   first and second electrodes; and
   a phase-changeable material region disposed between the first and second electrodes and comprising a first portion in contact with the first electrode, a second portion in contact with the second electrode, and a filamentous third portion connecting the first and second portions.

7. The memory device of claim 6, wherein a contact area of the first portion and the first electrode and a contact area of the second portion and the second electrode are each greater than a cross-sectional area of the third portion.

8. The memory device of claim 6, wherein the first and second electrodes and the phase-changeable material region are configured to confine phase change substantially to the third portion.

9. A method of fabricating a memory device comprising:
   forming first and second electrodes; and
   forming a phase-changeable material region in contact with the first and second electrodes and comprising a first portion in contact with the first electrode, a second portion in contact with the second electrode, and a filamentous third portion connecting the first and second portions.

10. The method of claim 9, wherein a contact area between the phase-changeable material region and the first electrode and a contact area between the phase-changeable material region and the second electrode are each greater than a cross sectional area of the third portion.

11. The method of claim 9:
   wherein forming first and second electrodes comprises forming the first electrode on a substrate;
   wherein forming a phase-changeable material region in contact with the first and second electrodes and comprising a first portion in contact with the first electrode, a second portion in contact with the second electrode, and a filamentous third portion connecting the first and second portions comprises forming the phase-changeable material region on the first electrode; and
   wherein forming first and second electrodes further comprises forming the second electrode on the phase-changeable material region.

12. The method of claim 11, wherein forming the phase-changeable material region on the first electrode comprises:
   forming a first insulation layer on the first electrode;
   forming a second insulation layer on the first insulation layer;
   forming an opening in the second insulation layer exposing the first insulation layer;

etching the first insulation layer via the first opening to form a void above the first electrode;

forming a phase-changeable material layer on the second insulation layer and occupying the void and the opening in the second insulation layer; and patterning a portion of the phase-changeable material layer on the second insulation layer.

13. The method of claim 12, wherein etching the first insulation layer via the first opening to form a void above the first electrode comprises etching the first insulation layer laterally with respect to the opening to form the void.

14. The method of claim 11, wherein the first electrode comprises TiN, TaN, WN, MoN, NbN, TiSiN, TiAlN, TiBN, ZrSiN, WSiN, WBN, ZrAlN, MoSiN, MoAlN, TaSiN, TaAlN, Ti, W, Mo, Ta, TiSi, TaSi, TiON, TiAlON, WON, TaON, and/or a conductive carbon group.

* * * * *